US005428300A

United States Patent [19]

Takahashi et al.

[11] Patent Number: 5,428,300

[45] Date of Patent: Jun. 27, 1995

[54] METHOD AND APPARATUS FOR TESTING TFT-LCD

[75] Inventors: Isamu Takahashi; Tadashi Oshimi, both of Tokyo, Japan

[73] Assignee: Telenix Co., Ltd., Tokyo, Japan

[21] Appl. No.: 121,798

[22] Filed: Sep. 15, 1993

[30] Foreign Application Priority Data

Apr. 26, 1993 [JP] Japan .............................. 5-133796

[51] Int. Cl.[6] .............................................. G01R 1/04

[52] U.S. Cl. .................................... 324/770; 324/769; 324/537

[58] Field of Search ........... 324/519, 672, 686, 140 R, 324/73.1, 72, 115, 158 R, 750–772

[56] References Cited

U.S. PATENT DOCUMENTS

| | | | |
|---|---|---|---|
| 5,057,780 | 10/1991 | Akama et al. | 324/537 |
| 5,179,345 | 1/1993 | Jenkins et al. | 324/678 |
| 5,266,901 | 11/1993 | Woo | 324/537 |

*Primary Examiner*—Kenneth A. Wieder
*Assistant Examiner*—Barry C. Bowser
*Attorney, Agent, or Firm*—Burgess, Ryan & Wayne

[57] ABSTRACT

A method and apparatus for testing TFT-LCD's turns on a TFT in an active color LCD using TFT's, charges a cell capacitor connected to the LCD through the data line, keeps the capacitor charged after turning off the TFT, discharges the capacitor through a resistor connected to the grounding side through the source and drain of the TFT, and checks the function of the TFT-LCD and the connection of the elements contained therein based on the waveform of a current or discharge induced by the discharge.

16 Claims, 10 Drawing Sheets

METHOD AND APPARATUS FOR TESTING TFT-LCD

BACKGROUND OF THE INVENTION

This invention relates to a method and apparatus for testing TFT-LCD's (thin-film transistor liquid crystal displays) used as active-matrix color LCD's.

Recently active-matrix LCD's are extensively used as color displays. The active-matrix LCD writes necessary signals into the liquid crystal only for a given short period of time, holding the written signals during other times by keeping open the gate of the input circuit to liquid crystal. The feature of the active-matrix LCD is that the liquid crystal serves as a dynamic memory.

To ensure that the gate is kept open only for the length of time required for the writing of signals and closed during other times, TFT's (thin-film transistors) or FET's (field-effect transistors) are commonly used.

Recently TFT-LCD's are finding increasing use as active-matrix liquid crystal color displays.

As schematically shown in FIG. 1, a TFT-LCD has many pixels, with a correspondingly large number of TFT's 4 gate lines 3 and data lines 5 allocated to each pixel.

However, there is no sure guarantee that the TFT's 4 always function normally, they are properly connected to the data lines 5 and/or gate lines 3, and the data and gate lines are kept in proper relationship.

Accordingly, pre-assembly test of their functions and arrangement are indispensable to LCD's.

Nevertheless, no efficient testing method has been established for TFT-LCD's. Such being the case, most TFT-LCD's have conventionally been assembled either without such preliminary test or, at best, after checking the relationship of each TFT with its peripheral lines.

One of the methods so far proposed discharges the electricity stored by applying voltage through a data line to an LCD cell capacitor (or an auxiliary capacitor connected in parallel thereto) by controlling the on-off action of a TFT and checks the normality of the individual connections therein by measuring the amount of electric charge induced by the discharging.

This method necessitates an extra integrator (which is, to be specific, an integrating capacitor) and other associated apparatus for the measurement of the charge. Provision of such extra integrator and associated apparatus, however, is troublesome and uneconomical.

The object of this invention is to provide a simple and efficient method and apparatus for checking the normality of the individual elements of TFT-LCD's mentioned before without employing an integrating capacitor and other associated apparatus.

SUMMARY OF THE INVENTION

To achieve the above object, a method for testing an active color TFT-LCD according to this invention comprises the steps of turning on a TFT, charging the cell capacitor thereof through a data line, turning off the TFT but maintaining the charged condition, turning off the TFT again, discharging through a resistor connected to the grounding side through the source and drain of the TFT, and judging whether the TFT functions normally and the elements therein are properly wired by the waveform of current or voltage induced by the discharge.

An apparatus for performing the test just described according to this invention comprises a waveform detector to determine the waveform of an electric current passing through a resistor connected to the source side of the TFT or the waveform of a voltage at both ends of the same resistor.

DETAILED DESCRIPTION OF THE INVENTION

Figure 1:
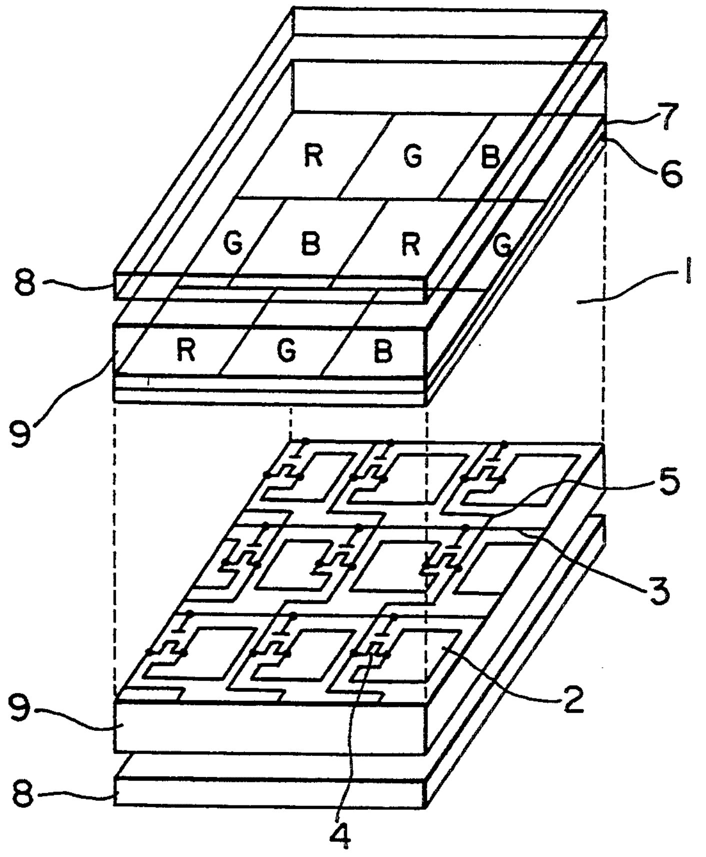
FIG. 1 is a schematic diagram showing the fundamental structure of a TFT-LCD.
Figure 2:
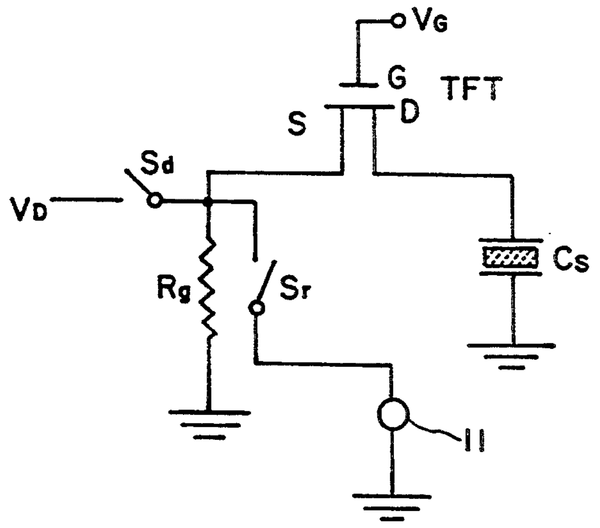
FIG. 2 is a basic circuit diagram showing the basic configuration of a TFT-LCD circuit to be tested by the method and apparatus of this invention.

Referring now to FIG. 2, the basic principle of this invention will be described.

FIG. 2 shows a cell capacitor $C_s$ composed of a charge of one liquid crystal cell according to this invention and an auxiliary charge applied when TFT's are arrayed (actually, the auxiliary charge itself constitutes the cell capacitor $C_s$ when TFT's are arrayed, and the auxiliary charge and the charge of a liquid crystal cell constitute the capacitor $C_s$ when liquid crystal has been filled in each cell), a TFT connected through the drain side thereof, a data line connected to the source side of the TFT, a gate line connected to the gate side of the TFT, a first switch $S_d$ interposed between a resistor $R_g$ connected to the source side of the TFT and the data line, a waveform detector 11 to check the waveform of a current passing through the resistor $R_g$, and a second switch $S_r$ interposed between the resistor R and the waveform detector 11.

Figure 3:
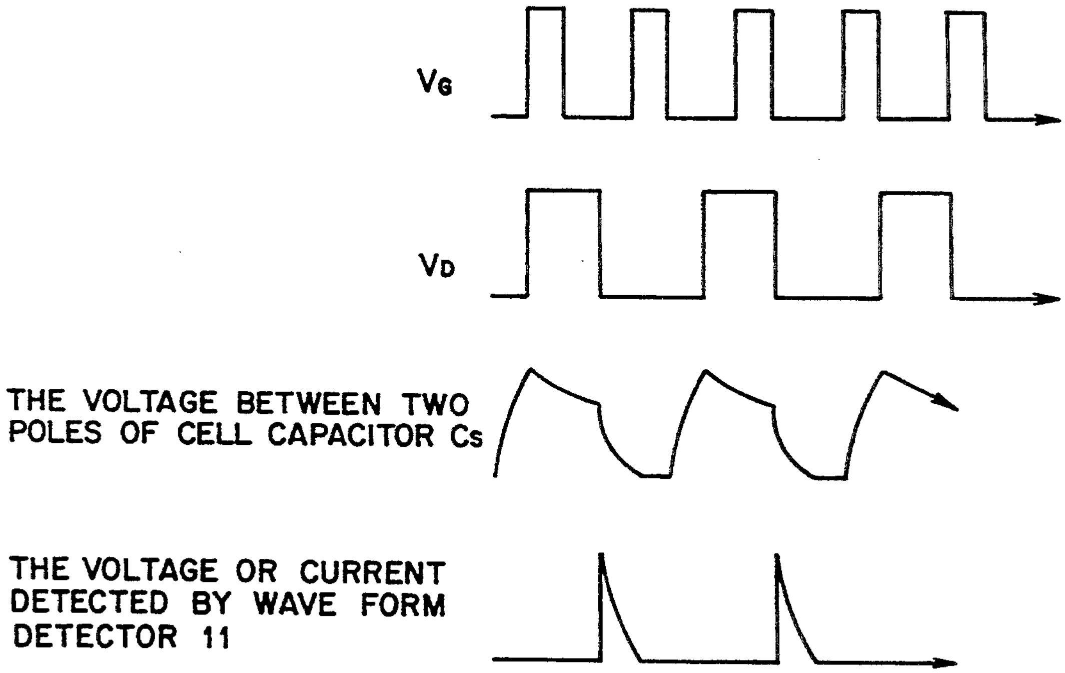
FIG. 3 is a graphical representation of a voltage waveform snowing the operational principal of the individual elements to be tested by the method and apparatus of this invention.

When a gate voltage $V_G$ and a data voltage $V_D$ shown in FIG. 3 are applied on the circuit shown in FIG. 2 and the switch $S_d$ is turned on, the cell capacitor $C_s$ is charged with the data voltage $V_D$ while a pulse voltage of the gate voltage $V_G$ exits.

While the first switch $S_d$ is on, the second switch $S_r$ is off as there is no need to check the data voltage $V_D$ with the waveform detector 11.

After the pulse of the gate voltage $V_G$ has passed through and the TFT goes off, the resistance between the source and drain of the TFT becomes $10^5$ to $10^6$ times greater than that built up while the TFT is turned on by the gate voltage $V_G$. Therefore, the cell capacitor $C_s$ remains charged, with the charge held thereby decreasing only slowly through leakage.

If the first switch $S_d$ is turned off and the switch $S_r$ between the drain and the waveform detector is turned on when the TFT goes on again between the source and drain thereof with the passage of a pulse of the gate voltage $V_G$, the charge held in the cell capacitor C, is discharged through the resistor $R_g$ connected to the drain and source.

The first switch $S_d$ is turned off so that the discharged current causes no trouble to the data line power supply. Still, the first switch $S_d$ is not an indispensable component element of this invention.

The resistor $R_g$ is a resistor that is provided between the drain of each TFT and a ground connection including a guard ring while the guard ring is connected to each terminal during the manufacture of a TFT-LCD and artificially connected for the convenience of measurement by the waveform detector 11 when the guard ring is disconnected. As such, the resistance offered by the resistor $R_g$ is smaller than about 1/100 of the resistance ($R_{on}$) that normally exists between the source and drain when the TFT is on.

By turning on the second switch $S_r$, the waveform from the discharge. Still, the second switch $S_r$ also is detector detects the electric current or voltage resulting not an indispensable component element of this invention.

The waveform of the voltage or current resulting from the discharge may be analyzed by means of an analog oscilloscope. However, more accurate analysis can be made by the use of a time-series graphical display of the waveform of an output voltage or current reproduced by a computer. This latter method permits a faster waveform analysis.

Part of the waveform of the voltage or current resulting from the discharge is saw-toothed as shown by the last waveform in FIG. 3. The time constant in this case is approximately $T=C_s(R_{on}+R_g)$.

Now that the volume of the cell capacitor $C_s$ is known, the cell capacitor, gate line and data line of the TFT being tested prove to be properly connected if the time constant of the current wave passing through the resistor $R_g$ agrees with the predicted value.

If, by contrast, the time constant T of the discharge-induced voltage or current changes and the waveform thereof disagrees with the predicted one, the value of the resistance $R_{on}$ or the volume of the cell capacitor $C_s$ should be construed as deviating from the specified value. Such deviation indicates the presence of connection irregularity in or around the TFT.

If the cell capacitor $C_s$ has stored no electricity therein, no current flows through the resistor $R_g$, which, in turn, indicates the presence of irregularity in the connection between the TFT and the gate or data line.

Concrete examples of the discharge output and irregularities in individual elements and connection therebetween are given below.

When testing the function and connection of the TFT-LCD's corresponding to all pixels by the use of a relay, the gate lines corresponding to the horizontal rows of the TFT's and the data lines corresponding to the vertical rows of the TFT's are switched one by one, as will be discussed later in the description of a first embodiment of this invention.

Figure 4A:
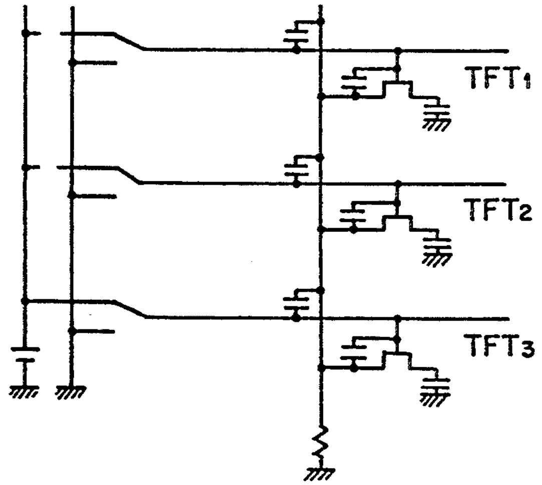
FIG. 4 shows a diagram of a TFT-LCD circuit whose data line is disconnected and a graphical representation of an output from the detecting side thereof at (a) and (b), respectively.
Figure 4B:
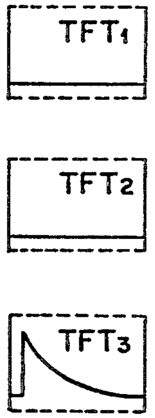

If the data line between $TFT_2$ and $TFT_3$ is disconnected as shown at (a) in FIG. 4, no waveform to show the presence of discharge appears at $C_{s1}$ and $C_{s2}$ which are not charged, as shown at (b) in FIG. 4.

By contrast, $C_{s3}$ is charged and shows the waveform of a discharge.

Then, disconnection of the data line can be determined from the variation in the waveform of discharge among the individual gates as shown at (b) in FIG. 4.

Figure 5A:
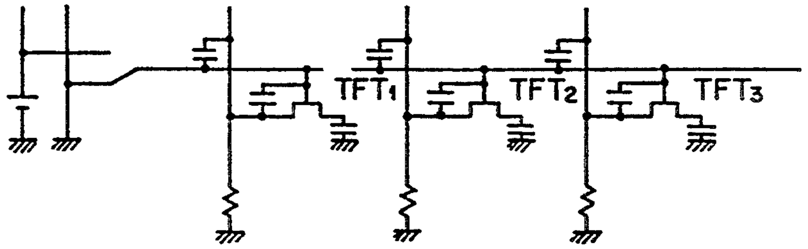
FIG. 5 shows a diagram of a TFT-LCD circuit whose gate line is disconnected and a graphical representation of an output from the detecting side thereof at (a) and (b).
Figure 5B:

When the gate line is disconnected between $TFT_1$ and $TFT_2$ as shown at (a) in FIG. 5, $C_{s1}$ and $C_{s2}$ are not charged and, therefore, show no waveform of discharge.

By comparison, $C_{s1}$ is charged and shows a waveform of discharge.

As such, disconnection of the gate line can be located by studying such variation in the waveforms of discharge from the individual gate lines as shown at (b) in FIG. 5.

Figure 6A:
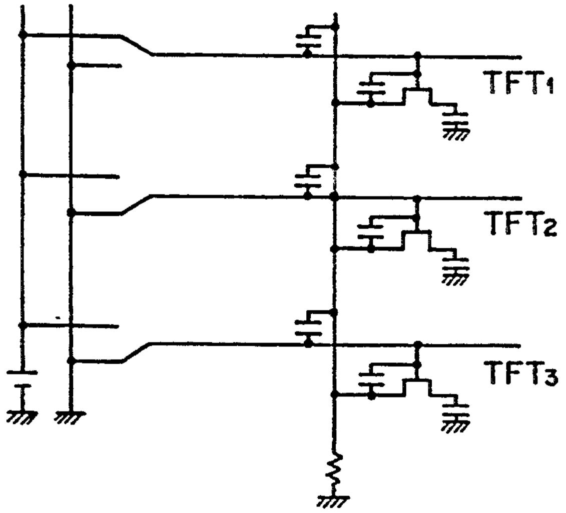
FIG. 6 shows a diagram of a TFT-LCD circuit whose data and gate lines are short-circuited and a graphical representation of an output from the detecting side thereof at (a) and (b).
Figure 6B:
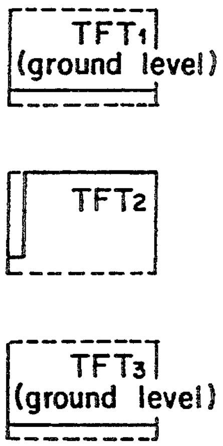

When the gate line connected to $TFT_2$ is short-circuited to the data line as shown at (a) in FIG. 6 and to the power supply, the voltage applied on the gate line itself appears at the data terminal as shown at (b) in FIG. 6 because the data line is connected to the gate line.

In determining the waveform of output, however, the waveform input circuit usually is highly amplified. The highly amplified waveform input circuit saturates the measured value of output and often disables the measurement of the desired waveform.

When $TFT_1$ and $TFT_3$ correspond to gate lines not short-circuited to other data lines, the data lines are grounded through the short-circuited points even when the gate lines are connected to the power supply. Accordingly, horizontal outputs produced by the grounding voltage appear as shown at $TFT_1$ and $TFT_2$ at (b) in FIG. 6.

Thus, the irregular output waveforms shown at (b) in FIG. 6 manifest the presence of a short-circuit between the data and gate lines.

When the gate and source of $TFT_2$ are short-circuited, an output waveform identical to the one for a short-circuit between the data and gate lines appears because the power supply from the gate line is measured through $TFT_3$.

In this case, it is necessary to determine whether a saturated output as shown at $TFT_2$ at (b) in FIG. 6 is due to a short-circuit between the data and gate lines or between the gate and source of the TFT by checking through $TFT_2$.

Figure 7A:
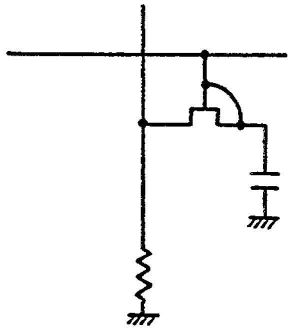
FIG. 7 shows a diagram of a TFT-LCD circuit whose gate and drain are short-circuited and a graphical representation of an output from the detecting side thereof at (a) and (b).
Figure 7B:
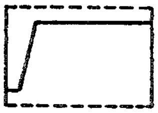

When the gate and drain of a TFT is short-circuited as shown at (a) in FIG. 7, the data and gate lines are connected through the gate and drain of the TFT. When discharge output is determined while the gate line is on, an output divided by resistance $R_{on}$ that appears when the TFT is on and resistance $R_g$ against detection, which is expressed as $R_g/(R_{on}+R_g)$, appears.

Actually, the presence of a slight capacitance between the gate and drain gives rise to some time delay. Therefore, a constant output appears following a substantially linear rise time as shown at (b) in FIG. 7.

Accordingly, the output shown at (b) in FIG. 7 manifests the presence of a short-circuit between the gate and drain of a TFT.

Figure 8A:
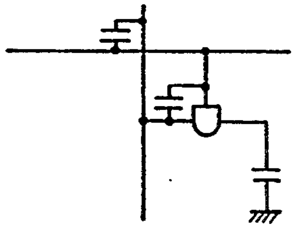
FIG. 8 shows a diagram of a TFT-LCD circuit whose source and drain are short-circuited and a graphical representation of an output from the detecting side thereof at (a) and (b).
Figure 8B:

When the source and drain of a TFT is short-circuited as shown at (a) in FIG. 8, $C_s$ cannot be charged with the voltage or current from the gate line. Consequently, no waveform of discharge appears.

Because there is a combined capacity obtained through a TFT between the gate and data lines, however, a curve of rapid extinction (which is generally called a sneak curve of gate-applied voltage) appears as shown at (b) in FIG. 8.

Thus, the curve of extinction shown at (b) in FIG. 8 manifests the presence of a short-circuit between the source and drain of a TFT.

When a cell capacitor $C_s$ does not function properly, drain of a TFT and the capacitor $C_s$ are short-circuited, with both electrodes thereof short-circuited, or when the neither charging nor discharging is possible. Then, an output waveform shown at (b) in FIG. 8 appears.

In this instance, it is necessary to determine whether the output waveform is due to a short-circuit between the source and drain of a TFT, or a short-circuit between both electrodes of the capacitor $C_s$, or a short-circuit between the drain of a TFT and the capacitor $C_s$.

When the gate of a TFT and the gate line are disconnected, the capacitor $C_s$ is not charged through a TFT, as a consequence of which no discharge waveform appears.

Figure 9A:
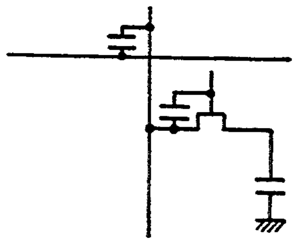
FIG. 9 shows a diagram of a TFT-LCD circuit whose gate and gate line and drain are short-circuited and a graphical representation of an output from the detecting side thereof at (a) and (b).
Figure 9B:
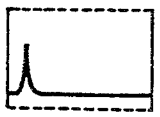

The output waveform appearing in this case is due to the stray capacitance between the gate and data lines and the resistor $R_g$ connected to the data line, as shown at (b) in FIG. 9.

However, the resulting discharge output is smaller than the one due to a short-circuit between the source and drain or the one due to a short-circuit of the capacitor $C_s$. When the source side of a TFT and the data line are short-circuited, the capacitor $C_s$ is charged and discharged, with an output waveform shown at (b) in FIG. 9 obtained.

In this instance, it is necessary to determine which of the gate and source lines of a TFT is short-circuited.

As is obvious from the above, the function of a TFT-LCD and the connection of its wiring can be roughly checked by analyzing the waveform of discharge outputs.

Some examples of this invention based on the operational principle just described are given below.

Embodiment 1

Figure 10:
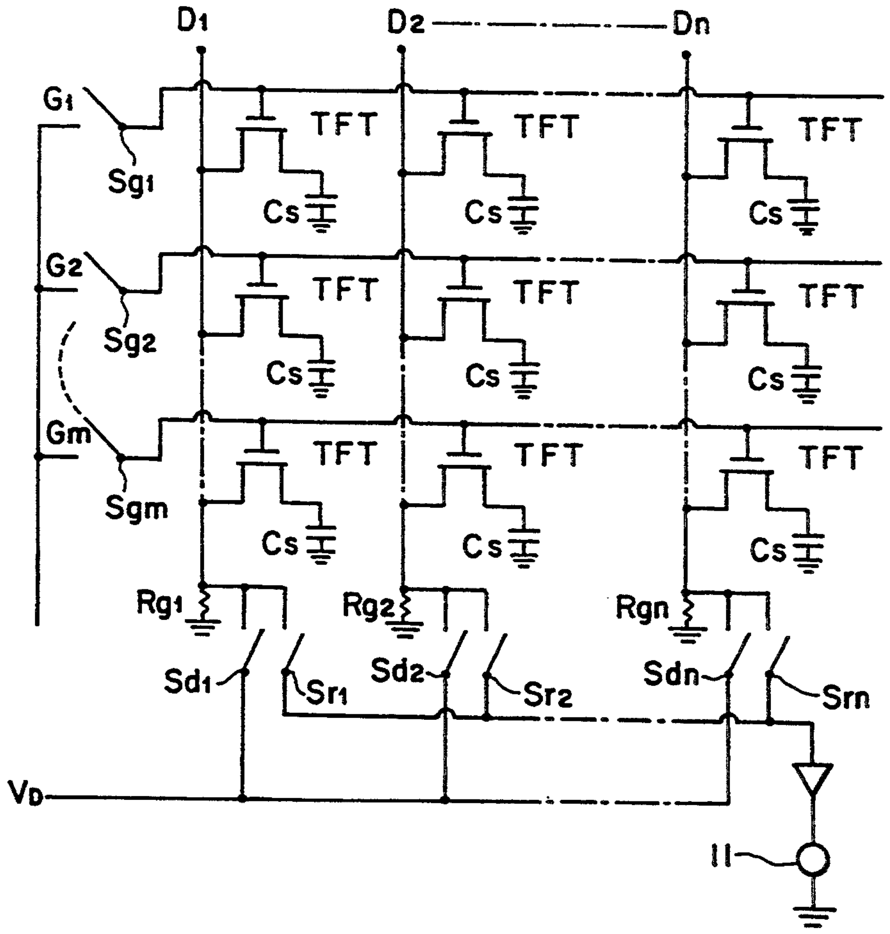
FIG. 10 is an overall circuit diagram showing the circuit configuration of a first embodiment of this invention.
Figure 11A:
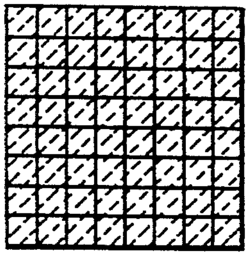
FIG. 11 is a schematic plan view of the array of a TFT-LCD showing the circuit configuration of a second embodiment of this invention.
Figure 11B:
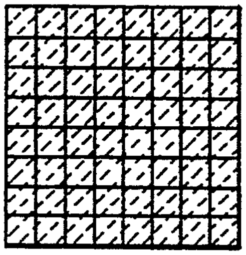
Figure 11C:
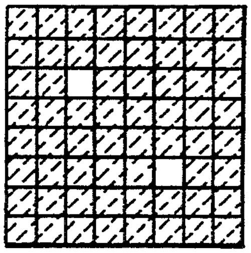
Figure 11D:
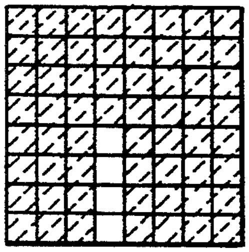
Figure 11E:
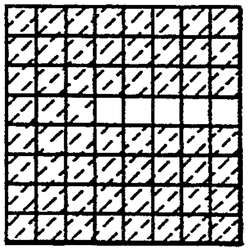

FIG. 10 shows an embodiment of this invention.

Switches $S_{g1}$, $S_{g2}$, . . . $S_{gm}$ are provided to the gate lines $G_1$, $G_2$, . . . $G_m$ connected to the horizontal rows of the TFT's corresponding to the individual pixels, switches $S_{d1}$, $S_{d2}$, . . . $S_{dn}$ to the data lines $D_1$, $D_2$, . . . $D_n$ connected to the vertical rows thereof, and switches $S_{r1}$, $S_{r2}$, . . . $S_{rn}$ to the data lines connected to the waveform analyzer.

By making and breaking the switches $S_{g1}$, $S_{g2}$, . . . $S_{gm}$, switches $S_{d1}$, $S_{d2}$, . . . $S_{dn}$, and switches $S_{r1}$, $S_{r2}$, . . . $S_{rn}$ shown in FIG. 10, one after another, using a relay, whether or not the TFT's corresponding to the individual pixels are properly connected can be determined efficiently.

The resistor $R_g$ is provided on each data line between a junction with the relay and a junction with the ground to facilitate the measurement of the discharge output. To minimize measurement errors, the resistance the resistor $R_g$ offers is not more than approximately 1/100 of the resistance $R_{on}$ that is offered when a TFT is on.

By contrast, the amplifier for measurement is designed to have a large input impedance.

Even when the data and gate lines are short-circuited as shown at (a) in FIG. 6, most of the current flows through the resistors $R_{g1}$, $R_{g2}$, . . . , thereby preventing the direct input of the gate power supply into the input device of the amplifier and, thus, protecting the amplifier and the measuring device.

Embodiment 2

Normal operation of all TFT's are assured when all cell capacitors are charged as shown at (a) in FIG. 11 and show normal waveforms as shown at (b) in the same figure.

When time constant T deviates at several spots as shown at (c) in FIG. 11, either or both of TFT and LCD are out of order. If no waveform is shown, in particular, the TFT in the deviating spot is disconnected from either the gate line or data line.

When all or part (as shown at (d) in FIG. 11) of a specific horizontal row shows no discharge waveform as shown at ( ) in FIG. 11, the connection between the data line and the row in question is out of order.

When the gate lines of a specific vertical row show no discharge waveform as shown at (e) in FIG. 11, the connection of the gate lines of the row in question is out of order.

Embodiment 3

Figure 12A:
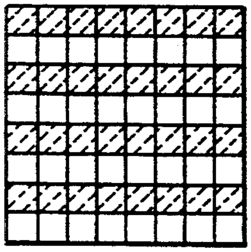
FIG. 12 is a schematic plan view of the array of a TFT-LCD showing the circuit configuration of a third embodiment of this invention.
Figure 12B:
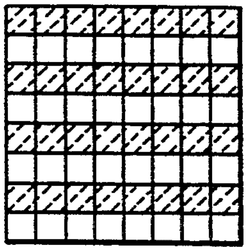
Figure 12C:
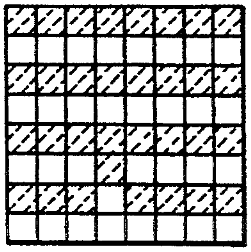

Normal operation of all TFT's is assured when the gate-line-connected cell capacitors in alternate horizontal rows are charged as shown at (a) in FIG. 12 and show normal discharge waveforms as shown at (b) in the same figure.

If any uncharged gate line shows a discharge waveform as shown at (c) in FIG. 12, by contrast, there is a short-circuit between the gate line in question and an adjoining area.

Embodiment 4

Figure 13A:
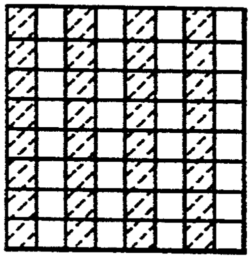
FIG. 13 is a schematic plan view of the arrangement of a TFT-LCD showing the circuit configuration of a fourth embodiment of this invention.
Figure 13B:
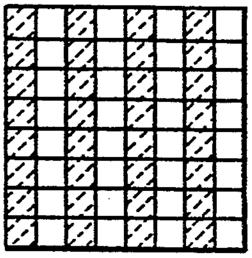
Figure 13C:
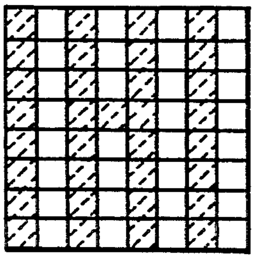

Proper connection of at least charged TFT's is assured when the date-line-connected cell capacitors in alternate vertical rows are charged and discharged as shown at (a) in FIG. 13 and show normal discharge waveforms as shown at (b) in the same figure.

If any uncharged data line shows a discharge waveform as shown at (c) in FIG. 13, by contrast, there is a short-circuit between the date line in question and an adjoining area.

The overall condition of a TFT-LCD can be inspected by the use of a display panel corresponding to the arrangement of the individual TFT's. Irregularities can be readily determined from an image reproduced on the display panel.

Embodiment 5

When normal, the capacitance of a cell capacitor $C_s$ and the resistance offered by resistors $R_g$ and $R_{on}$ are all known.

When the individual elements described before and the connection thereof are normal, accordingly, the upper and lower limits of the discharge voltage or current detected by the waveform analyzer shown in FIG. 2 are naturally fixed.

Figure 14:
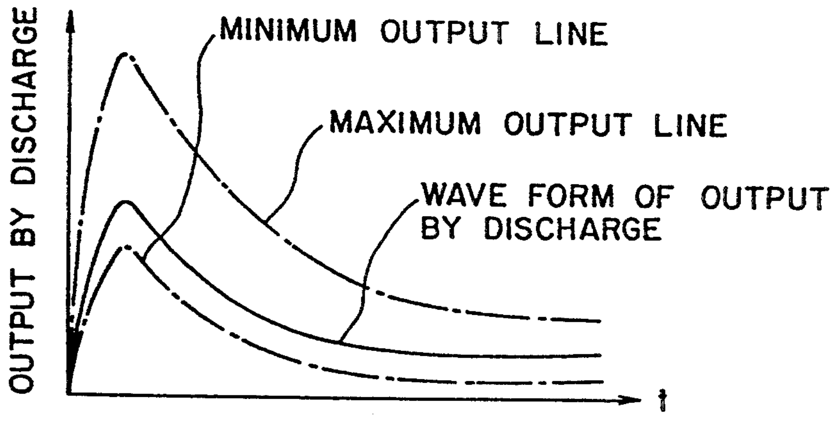
FIG. 14 is a graphical representation of output discharge showing the operational principle of a fifth embodiment of this invention.

As such, the function and connection of all elements in a TFT-LCD can be checked by determining whether the detected output of discharge voltage or current is between the upper and lower limits shown in FIG. 14.

In the fifth embodiment, switches $S_{g1}$, $S_{g2}$, . . . $S_{gm}$ are provided to the gate lines $G_1$, $G_2$, . . . $G_m$ connected to the horizontal rows of the TFT's corresponding to the individual pixels, switches $S_{d1}$, $S_{d2}$, . . . $S_{dn}$ to the data lines $D_1$, $D_2$, . . . $D_n$ connected to the vertical rows thereof, and switches $S_{r1}$, $S_{r2}$, . . . $S_{rn}$ to the data lines connected to the waveform analyzer, as shown in FIG. 10. By making and breaking the switches $S_{g1}$, $S_{g2}$, . . . $S_m$, data switches $S_{d1}$, $S_{d2}$, . . . $S_{dn}$, and relay switches $S_{r1}$, $S_{r2}$, . . . $S_{rn}$ using relays, whether the TFT's corresponding to the individual pixels are properly connected can be efficiently checked one after another. An oscilloscope serving as the waveform detector 11 is connected to the relay side. Then, the function and connection of the individual elements can be checked by determining whether the waveforms of discharge that appear on the oscilloscope each time the data and gate lines are switched are between the maximum and minimum outputs as shown in FIG. 14.

The use of an oscilloscope inevitably involves visual check of the displayed waveform and pinpointing of the defective data and gate lines. This embodiment is not always suited for the examination of devices having many liquid crystals because its function depends on visual examination.

Embodiment 6

This embodiment also checks whether the waveform of discharge is between the maximum and minimum output, as in the case of the preceding embodiment. In this embodiment, however, different lengths of time following a discharge and different sets of maximum and minimum discharges made during the specified lengths of time are predetermined. Then, the function and connection of the individual elements are checked by determining, using a microcomputer, whether the voltage or current discharged within each given length of time is within the normal limits.

Unlike the fifth embodiment, the sixth embodiment does not necessitate the application of visual inspection to all discharge outputs.

Figure 15:
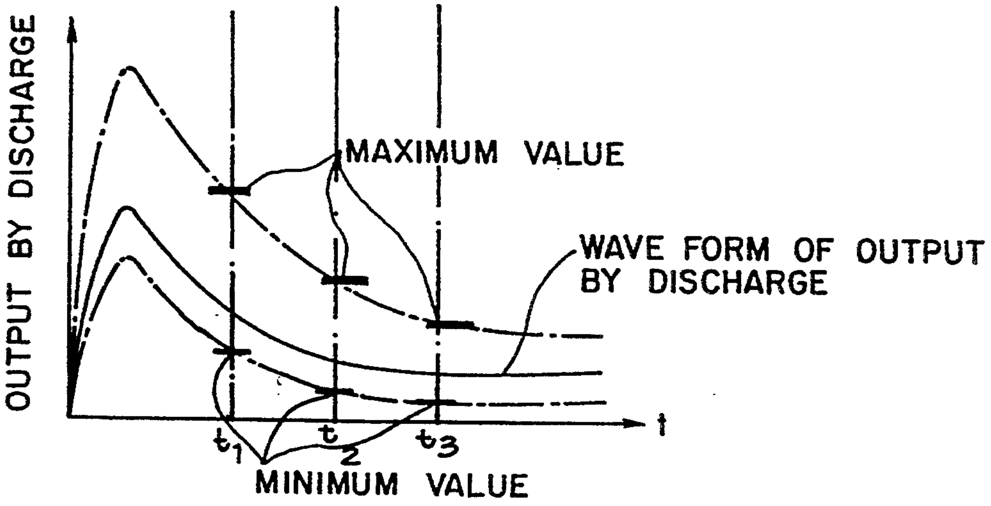
FIG. 15 is a graphical representation of output discharge showing the operational principle of a sixth embodiment of this invention.

An actual discharge curve initially rises because of stray capacitance as shown in FIG. 15. Then, the stray capacitance decreases according to the exponential function of an ordinary discharge curve. Therefore, the desired check can be made by examining the data obtained immediately after the completion of the initial rise and during a few predetermined lengths of time (as indicated by $t_1$, $t_2$ and $t_3$ in FIG. 15).

Embodiment 7

The seventh embodiment considers the stray capacitance existing between the gate and data lines and the ground.

Figure 16A:
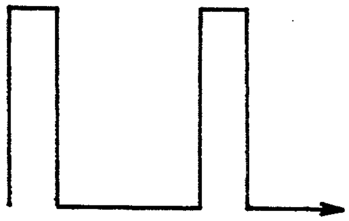
FIG. 16 is a graphical representation of different voltages impressed into different points of a TFT-LCD showing the operational principle of a seventh embodiment of this invention at (a) and (b).
Figure 16B:
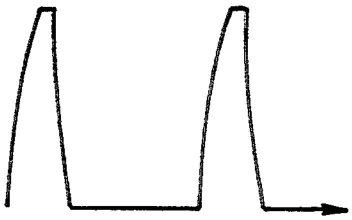

Stray capacitance exists between the gate and data lines and the ground. Therefore, the gate turns on with a time lag as the distance from the actuating point increases. Even when the gate turns off after a given time, no rectangular pulse as shown at (a) in FIG. 16 is applied on the capacitor $C_s$. Actually, charging and discharging is carried out by the current or voltage slowly applied after the output in the rise time as shown at (b) in FIG. 16.

Figure 17A:
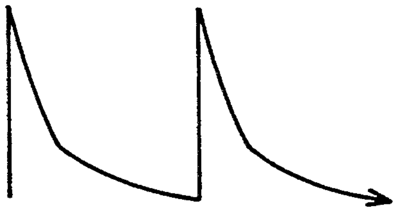
FIG. 17 is a graphical representation of different voltages discharged from different points of a TFT-LCD showing the operational principle of a seventh embodiment of this invention at (a) and (b).
Figure 17B:
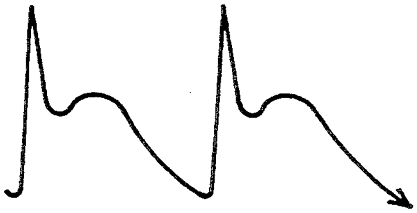

Accordingly, the discharge outputs of the TFT's and LCD's distant from the actuating point on the gate side do not exhibit a typical curve of exponential function as shown at (a) in FIG. 17, but a curve with a slow rise and a gentle curve of discharge as shown at (b) in the same figure.

Therefore, the upper and lower limits of the normal output discharge curves of the fifth and sixth embodiments differ with the position of the TFT-LCD's. Basically, as such, it is desirable to show the upper and lower limits of discharge output for each gate line and data line.

Actually, however, it is very troublesome to specify and check the upper and lower limits of output for each TFT-LCD.

Figure 18:
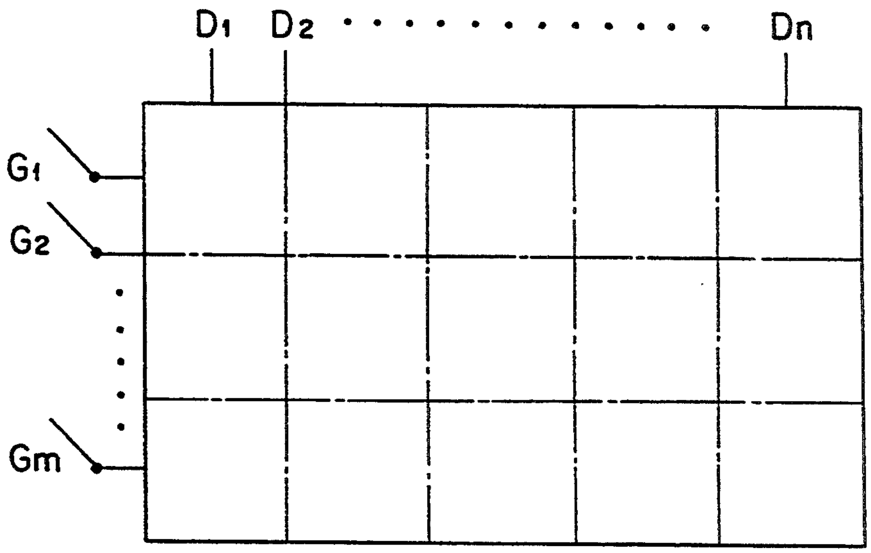
FIG. 18 is a schematic illustration of the segments of a TFT-LCD divided along the gate and data lines thereof showing the configuration of a seventh embodiment of this invention.
Figure 19A:
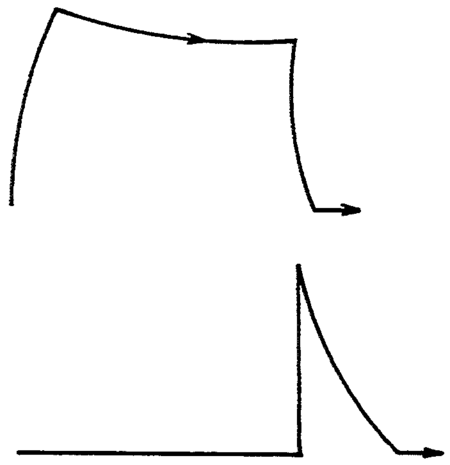
FIG. 19 is a graphical representation of the charging and discharging characteristics of a cell capacitor $C_s$ and the output discharged from the detecting side thereof showing the operational principle of an eighth embodiment of this invention at (a), (b), (c) and (d).
Figure 19B:
Figure 19C:
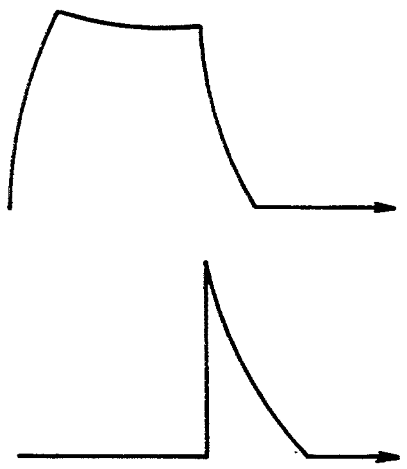
Figure 19D:
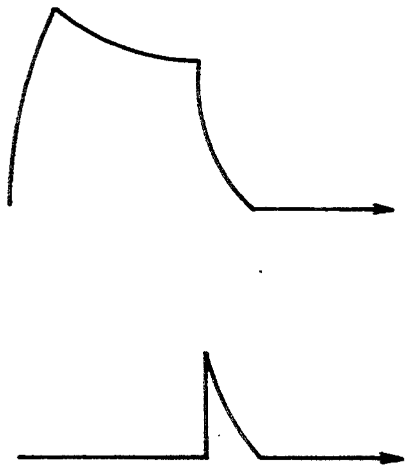

In the seventh embodiment, the TFT-LCD's are divided into groups according to the order of the gate and data lines as shown in FIG. 18, and the upper and lower limits of normal discharge output are specified for each group.

This method permits both specifying accurate upper and lower limits of discharge output for each group and accurate tests.

The TFT-LCD's connected to each data and gate line are usually divided into three to five groups, which makes the total number of groups nine (3×3) to twenty five (5× 5), though the number varies with the number of the gate and data lines.

This method can be implemented with the oscilloscope used in the fifth embodiment and the microcomputer used in the sixth embodiment.

Embodiment 8

The eighth embodiment checks whether the leakage resistance $R_{off}$, which appears when the TFT is off, is normal.

The leakage resistance $R_{off}$ governs the level of the slow discharge from the capacitor $C_s$ during time $T_h$ during which the TFT is off.

FIG. 19 shows the charged and discharged condition of the capacitor $C_s$ and the detected discharge output thereof discharged condition of the capacitor $C_s$ when $R_{on}$ is small when $R_{on}$ and $R_{off}$ are normal at (a). FIG. 19 also shows the than normal and $R_{off}$ is normal at (b). In the latter case, discharge attenuates quickly because of the small time constant.

In the fifth and sixth embodiments, whether the detected discharge output is between the maximum and minimum outputs was judged. If the same judgement is applied to this eighth embodiment, the output shown at (b) in FIG. 19 falls below the minimum output because the discharge attenuates quickly.

When $R_{on}$ alone is considered, the output is abnormally small. (Still, products whose $R_{on}$ is smaller, but not extremely so, than normal often prove to be acceptable.) When the leakage resistance $R_{off}$ is considered, by comparison, no judgement can be made on the basis of the discharge output represented by the lower curve at (b) in FIG. 19.

When determined on the basis of the time during which leakage resistance $R_{off}$ is expressed as $e=E.\exp(-t/C_s R_{off})$ the TFT is off, the discharge voltage passing over the (wherein E=the voltage between the two electrodes of the capacitor $C_s$ when the TFT is off).

Discharge output voltages $e_1$ and $e_2$ for two different leakage times $T_{h1}$ and $T_{h2}$ are expressed as follows:

$$e_1=E.\exp(-T_{h1}/C_sR_{off})$$

$$e_2=E.\exp(-T_{h1}/C_sR_{off})$$

(Here, the resistance $R_g$ shown in FIG. 2 is neglected as it is much smaller than $R_{off}$.)

When the TFT is turned on after the passage of $T_{h1}$ and $T_{h2}$, the capacitor $C_s$ outputs the following discharges:

$$\begin{aligned} e_{1'} &= e_1 \cdot \exp(-t/C_sR_{on}) \cdot R_g/(R_{on}+R_g) \\ &\approx e_1 \cdot \exp(-t/C_sR_{on}) \cdot R_g/R_{on} \\ e_{2'} &= e_2 \cdot \exp(-t/C_sR_{on}) \cdot R_g/(R_{on}+R_g) \\ &\approx e_2 \cdot \exp(-t/C_sR_{on}) \cdot R_g/R_{on} \end{aligned}$$

(Here, t is the time passed after the point at which the TFT is turned on. The resistance $R_g$ shown in FIG. 2 is neglected as it is much smaller than $R_{off}$.)

If the output voltages $e_1$, and $e_2$, after the different leakage times $T_{h1}$ and $T_{h2}$ exhibit substantially similar waveforms, the resistance $R_{off}$ is normal and the values of $e_1$ and $e_2$ are substantially similar.

When different leakage times $T_{h1}$ and $T_{h2}$ are set as shown at (c) and (d) in FIG. 19 in correspondence with (a) and (b) in the same figure and the output waveform $e_{2'}$ shown at (d) is substantially similar to the waveform $e_{1'}$ shown at (b), the leakage resistance $R_{off}$ is normal.

Whether the leakage resistance $R_{off}$ is normal can be determined by comparing the output waveforms corresponding to two different leakage times $T_{h1}$ and $T_{h2}$.

As is obvious from the above, the method of this invention, though simple in design, permits quickly checking the function of a TFT-LCD, the connection between each TFT and peripheral circuits and between the gate lines in individual horizontal rows and the data lines in individual vertical rows, and the presence of short-circuits between the gate lines and the data lines.

Particularly, the method that specifies the maximum and minimum discharge outputs not only makes the above checks but also quickly and easily checks whether the leakage resistance $R_{off}$ that appears when the TFT is turned off is normal.

As such, this invention is remarkably valuable as it permits checking the function of TFT-LCD's while they are being manufactured.

What is claimed is:

1. A method of testing a TFT-LCD comprising TFT's which comprises the steps of: (a) turning on a TFT in an active color LCD; (b) charging a cell capacitor of the LCD through a data line; (c) keeping the cell capacitor charged after turning off the TFT; (d) discharging the cell capacitor through a resistor connected to a grounding side thereof through a source and drain of the TFT after turning on the TFT again; and (e) checking a function of the TFT-LCD and a connection of the elements contained therein based on a waveform of the current or voltage induced by the discharge.

2. A testing method according to claim 1, in which said step of checking includes the step of checking irregularities in the function of all TFT's in a TFT-LCD and in the connection between each TFT and peripheral elements thereof and between specific gate lines and data lines by checking the data and gate lines connected to the TFT's one after another in the order in which the data and gate lines are arranged.

3. A testing method according to claim 2, in which the presence of a short-circuit between gate lines is checked by charging the cell capacitors connected to alternate gate lines.

4. A testing method according to claim 2, in which the presence of a short-circuit between data lines is checked by charging the cell capacitors connected to alternate data lines.

5. An apparatus for implementing the testing method according to claim 1 which comprises waveform analyzer means for detecting current flowing through a resistance connected to the source side of a TFT or a voltage at both ends of said resistor.

6. A testing apparatus according to claim 5 which comprises relay means for successively switching the connection of the gate and data lines connected to the TFT's, the relay means being connected to said waveform analyzer means.

7. A testing apparatus according to claim 6 which comprises a display panel having units of display corresponding to the individual cells of an LCD to show the location of an irregularity found by a test.

8. A testing method according to claim 1, which comprises the steps of presetting maximum and minimum discharge currents or voltages from a normally functioning TFT-LCD with properly connected elements and checking whether an actual discharge current or voltage is between the preset maximum and minimum currents or voltages.

9. A testing method according to claim 8, in which the connection of TFT's with the gate and data lines is successively switched by a relay that is connected to an oscilloscope and whether the image of the current or voltage from each gate, and checking data line formed on the oscilloscope is between curves representing the maximum and minimum currents or voltages.

10. A testing method according to claim 9, in which the connection of TFT's with the gate and data lines is successively switched by a relay that is connected to a microcomputer and checking whether values of the current or voltage from each gate and data line is between the maximum and minimum currents or voltages programmed into the microcomputer.

11. A testing method according to claim 9, in which the connection of TFT's with the gate and data lines is successively switched by a relay, a TFT-LCD is divided into sectors according to the order in which the gate and data lines are arranged, and the maximum and minimum discharge currents are preset for each of the divided sectors.

12. A testing method according to claim 1, in which two different times are set so that a TFT is turned off for different lengths of time and checking whether the leakage resistance, determined while the TFT is off, is normal by comparing the currents or voltages discharged during the two preset times.

13. A waveform analyzer for testing a TFT-LCD circuit containing at least one TFT, each TFT including a gate adapted to be supplied with a voltage from a gate line, a drain connected to a capacitive element, and a source connected to ground through a resistor, and a source line adapted to supply a data voltage thereto, said wave form analyzer comprising first switch means for connecting/disconnecting said source line from said source of said TFT;

waveform detector means for detecting a voltage or current across the resistor; and second switch means for connecting/disconnecting said waveform detector means to said resistor.

14. A waveform analyzer according to claim 13, wherein said first and second switch means each have one terminal connected to a connection point between said source of said TFT and said resistor.

15. A waveform analyzer according to claim 13, wherein said first switch means is connected between said source line and a connection between said source of said TFT and said resistor.

16. A waveform analyzer according to claim 13, wherein said second switch means has one end connected to a connection between such source of said TFT and said resistor, and a second, opposite end connected to said waveform detector means.

* * * * *